(12) United States Patent
Alieu et al.

(10) Patent No.: US 8,044,443 B2
(45) Date of Patent: Oct. 25, 2011

(54) PHOTOSENSITIVE INTEGRATED CIRCUIT EQUIPPED WITH A REFLECTIVE LAYER AND CORRESPONDING METHOD OF PRODUCTION

(75) Inventors: Jérôme Alieu, L'Isle d'Abeau (FR); Simon Guillaumet, Vaulnaveys-le-Haut (FR); Christophe Legendre, Allevard (FR); Hugues Leininger, Crolles (FR); Jean-Pierre Oddou, Grenoble (FR); Marc Vincent, Arvillard (FR)

(73) Assignee: STMicroelectronics S.A., Montrouge (FR)

( * ) Notice: Subject to any disclaimer, the term of this patent is extended or adjusted under 35 U.S.C. 154(b) by 138 days.

(21) Appl. No.: 11/603,961

(22) Filed: Nov. 21, 2006

(65) Prior Publication Data

US 2007/0138470 A1 Jun. 21, 2007

(30) Foreign Application Priority Data

Nov. 21, 2005 (FR) ..................... 05 11755

(51) Int. Cl.
*H01L 29/04* (2006.01)
(52) U.S. Cl. ... 257/290; 257/59; 257/684; 257/E21.004; 257/E21.022
(58) Field of Classification Search ............ 257/290, 257/E31.058, E33.077, E31.063, E31.115, 257/25.032, E27.133
See application file for complete search history.

(56) References Cited

U.S. PATENT DOCUMENTS

| | | | | |
|---|---|---|---|---|
| 4,342,044 A * | 7/1982 | Ovshinsky et al. | ............. | 257/54 |
| 5,451,766 A * | 9/1995 | Van Berkel | ................ | 250/208.1 |
| 5,966,573 A * | 10/1999 | Yu et al. | ......................... | 399/160 |
| 6,288,388 B1 | 9/2001 | Zhang et al. | | |
| 7,332,746 B1 * | 2/2008 | Takahashi et al. | ............. | 257/98 |
| 7,436,038 B2 * | 10/2008 | Engelmann et al. | ........... | 257/444 |
| 2002/0132261 A1* | 9/2002 | Dorsel et al. | ...................... | 435/6 |
| 2002/0167485 A1* | 11/2002 | Hedrick | ......................... | 345/156 |
| 2005/0040316 A1* | 2/2005 | Holm et al. | ................. | 250/208.1 |

OTHER PUBLICATIONS

Patent Abstract of Japan vol. 012, No. 322 & JP 63 086474 A, Aug. 31, 1988, Toshiba Corp.
Patent Abstract of Japan vol. 014, No. 292 & JP 02 094566 A, Jun. 25, 1990, Toshiba Corp.
French Search Report for FR 0511755 dated Apr. 27, 2006.

* cited by examiner

*Primary Examiner* — Cuong Q Nguyen
*Assistant Examiner* — Cathy N Lam
(74) *Attorney, Agent, or Firm* — Lisa K. Jorgenson; Kevin D. Jablonski; Graybeal Jackson LLP

(57) ABSTRACT

A method for producing a photosensitive integrated circuit including producing circuit control transistors, producing, above the control transistors, and between at least one upper electrode and at least one lower electrode, at least one photodiode, by amorphous silicon layers into which photons from incident electromagnetic radiation are absorbed, producing at least one passivation layer, between the lower electrode and the control transistors, and producing, between the control transistors and the external surface of the integrated circuit, a reflective layer capable of reflecting photons not absorbed by the amorphous silicon layers.

14 Claims, 1 Drawing Sheet

PHOTOSENSITIVE INTEGRATED CIRCUIT EQUIPPED WITH A REFLECTIVE LAYER AND CORRESPONDING METHOD OF PRODUCTION

PRIORITY CLAIM

The present application claims the benefit of French Patent Application No. 0511755, filed Nov. 21, 2005, which application is incorporated herein by reference in its entirety.

TECHNICAL FIELD

An embodiment relates to the field of the production of microchips. More specifically, an embodiment relates to the first phases in the production of a chip, in particular phases in the production of integrated circuits.

BACKGROUND

Chips are used in an increasing number of products for mainstream and professional use. Also, the development of electronic devices integrating optical products such as "webcam" cameras, photo or 3G mobile telephones, optical mice, and so on, requires the development of photosensitive chips.

SUMMARY

An embodiment relates specifically to these photosensitive chips, the photosensitivity being provided by photodiodes.

A photodiode is a junction diode designed to be used as a photodetector by exposing one side of the junction to optical radiation. This junction is intended to be illuminated by a window formed in the protective oxide layer of the chip and possibly placed under a microlens. The light that reaches the junction causes the current to increase proportionally to the illumination thereof, as described below.

Accordingly, an embodiment relates to a method for producing a photosensitive integrated circuit including the steps of:
  producing circuit control transistors,
  producing, above the control transistors, and between at least one upper electrode and at least one lower electrode, at least one photodiode, by amorphous silicon layers into which photons from incident electromagnetic radiation are absorbed, and
  producing at least one passivation layer, between the lower electrode and the control transistors.

The photodiode is configured so as to convert incident electromagnetic radiation into a current by the absorption of photons.

If the energy of the incident electromagnetic radiation is adequate, the photons are absorbed in the amorphous silicon layer. An electron of the silicon then goes from the valence band to the conduction band, creating an electron-hole pair.

Typically, a photodiode is constituted by a deposit of both n- and p-doped amorphous silicon (one n-doped layer and one p-doped layer). The n and p portions are respectively coupled to a circuit by means of an electrode array and a transparent electrode. When the junction is illuminated, the light absorbed there creates electron-hole pairs. The free electrons are drawn to the n portion and the holes are drawn to the p portion. The current (or the difference in potential) measured at the terminals of the junction is proportional, within a certain limit, to the illumination of the photodiode.

However, the photons of the incident radiation may not all be absorbed. And, depending on the illumination conditions, some light rays may not be absorbed by the amorphous silicon of the junction.

If the incidence of the rays occurs on a lower electrode of the electrode array, the rays are reflected and may be sent to the amorphous silicon.

However, if the incidence of the rays occurs between two lower electrodes, the rays are refracted, then absorbed by the intermetallic levels of the integrated circuit.

Also, by being absorbed under the photodiodes, these rays are no longer involved in the creation of electron-hole pairs, and are, therefore, lost to the device. This undesired absorption process reduces the quantum efficacy of the system.

The quantum efficacy is defined by the fraction of incident photons involved in the photocurrent and is dependent on the wavelength of the incident radiation.

An embodiment is intended to overcome the aforementioned disadvantages by proposing a solution designed to improve the quantum efficacy.

Therefore, a method according to an embodiment, which is otherwise consistent with the preamble above, also includes producing, between the control transistors and the external surface of the integrated circuit, a reflective layer capable of reflecting photons not absorbed by the amorphous silicon layers.

Owing to this arrangement, a ray that has not been absorbed by the amorphous silicon is reflected onto the reflective layer. It is thus returned to the amorphous silicon layer and can again generate an electron-hole pair.

In an embodiment of the method for producing an integrated circuit according to the present disclosure, the reflective layer is inserted between a passivation layer and the amorphous silicon layers.

The reflective layer, like each of the layers of the integrated circuit, may be produced by chemical vapor deposition (CVD). However, other techniques can be envisaged, such as SOL-GEL, SPIN-ON, ALD or PVD techniques. An oxidizing or non-oxidizing post-deposition annealing step can also be performed.

The reflective layer is advantageously produced from a white material such as a metal oxide, and preferably titanium oxide, aluminum oxide, zirconium oxide or magnesium oxide.

An embodiment also relates to a photosensitive integrated circuit including at least one photodiode configured to convert incident electromagnetic radiation into a current by the absorption of photons into at least one amorphous silicon layer by the creation of electron-hole pairs.

The integrated circuit according to an embodiment also includes a reflective layer capable of reflecting, inside the integrated circuit, the unabsorbed photons.

In an embodiment, the reflective layer is located just below the photodiode(s), inserted between a passivation layer and the amorphous silicon layers.

Also, the reflective layer is a white material produced from a metal oxide, the metal being selected from the group including at least titanium, aluminum, zirconium and magnesium.

In addition, the reflective layer has a reflection surface of which the roughness is chosen so as to produce a specular or diffuse reflection.

Finally, an embodiment relates to an electronic device including the integrated circuit as described.

BRIEF DESCRIPTION OF THE DRAWINGS

Other features and advantages will become clearer from the following description, given by way of a non-limiting example, in reference to the single appended FIGURE.

DETAILED DESCRIPTION

Figure 1:
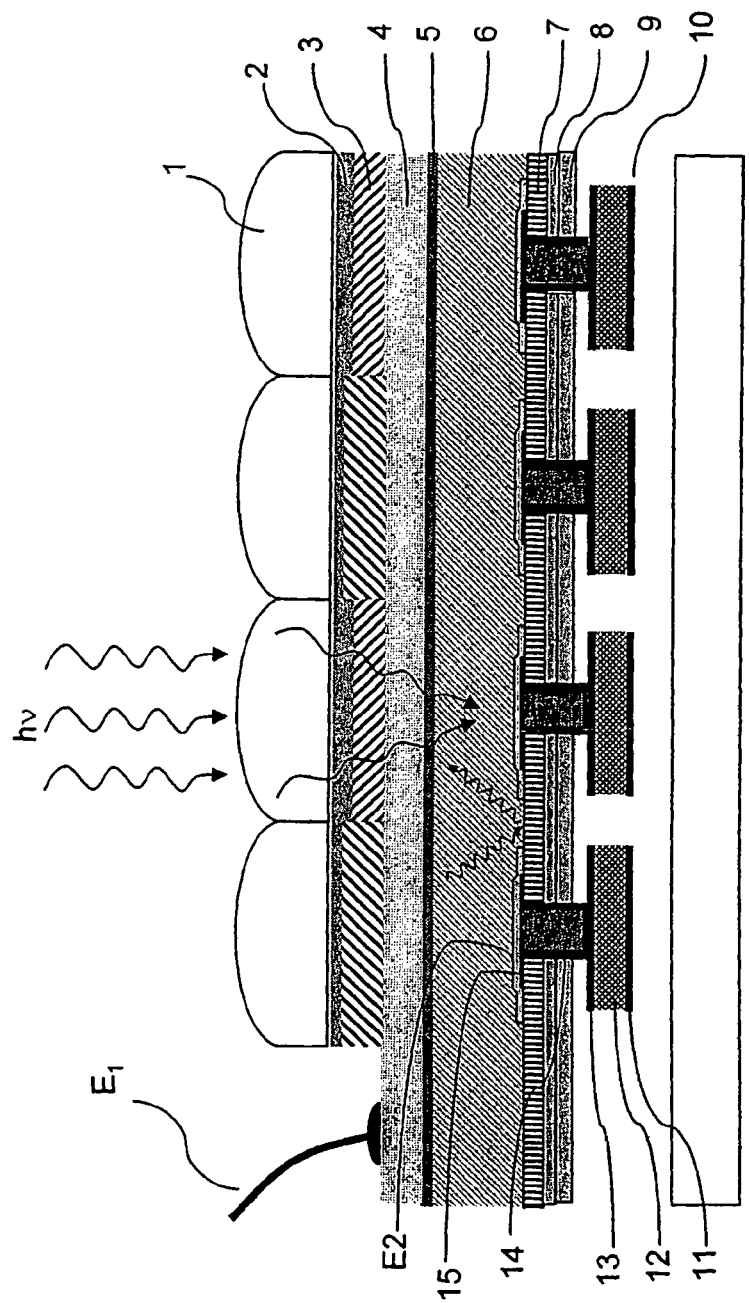
FIG. 1 shows a transversal cross-section of an integrated circuit according to an embodiment.

This embodiment is advantageously implemented in microchips satisfying standards CMOS180, CMOS120, CMOS090 or CMOS065. It can also be implemented in any other embodiments such as the following embodiments: a first embodiment in which the photodiodes (the photosensitive device) are in "back-end", i.e., in the upper levels of the integrated circuit; or a second embodiment in which the photodiodes (the photosensitive device) are in "front-end", i.e., in the lower levels of the integrated circuit.

These standards correspond to the gate widths of the transistors of the circuit, with standard CMOS065 corresponding to the smallest current technology, that is 65 nm.

For the sake of clarity, only the embodiment in which the photodiodes are in "back-end" will be described below. This embodiment is sometimes preferred because the presence of photodiodes in the upper levels of the integrated circuit often enables a maximum amount of light to be collected and transformed.

As shown in FIG. 1, a photosensitive integrated circuit includes at least one photodiode. The photodiode includes, for example, two amorphous silicon layers of which one 5 is p-doped and the other 6 is n-doped.

The p-doped layer is coupled to a circuit by means of an upper electrode 4 coupled to an electrode E1. The n-doped layer is coupled to a circuit by means of a lower electrode E2.

The upper electrode 4 is continuous, i.e., it has a continuous contact surface with the p-doped amorphous silicon layer of the photodiode.

The upper transparent electrode 4 may be constituted by an indium-doped tin oxide.

However, the lower electrode is discontinuous and is constituted, as shown in the single FIGURE, by a number of electrodes E2, separated from one another.

Each lower electrode E2 may be constituted by chromium or a chromium-based material.

In an embodiment, the circuit includes, above the upper electrode 4, one or more filters 3. These filters, for example colored, allow in this case for the separation of the incident light (hv) into basic components (e.g., red, green, blue).

The circuit may also include, on the side of its external surface, a planarizing layer 2 produced, for example, by deposition of a resin, and intended to level out the topography of the circuit associated with the production of colored filters with resins of various thicknesses.

In an embodiment, the circuit includes microlenses 1 positioned on the external surface of the circuit.

These microlenses make it possible to focus the incident radiation on the lower electrodes E2, each microlens being normally or otherwise optically aligned with a lower electrode, so as to optimize the quantum efficacy (the microlens 1 may be shifted relative to the respective electrodes E2 in outer regions of the array to account for the angle of the incident light).

Under the photodiodes, the circuit includes a passivation layer. This passivation layer can be separated into two layers, typically one 8 being made of a material such as silicon nitride and the other 9 being made of a material such as a phosphorus-doped oxide (PSG).

Under these passivation layers is an intermetallic insulation layer 10, typically an oxide.

Finally, under this intermetallic insulation layer are the circuit control transistors (not shown).

At the electronic level, each electrode E2 is coupled to a conductive element 14, such as metal, for example tungsten or copper, said element 14 itself being coupled to another conductor 12, such as metal, for example, aluminum or copper.

These elements are coupled two-by-two by a diffusion barrier (11, 13, 15), for example a titanium/titanium nitride alloy, of which at least one 11 has anti-reflective properties.

The circuit also has a reflective layer 7. In an embodiment, this layer is a white material made from a metal oxide in which the metal of the metal oxide is chosen from the group including at least titanium, aluminum, zirconium and magnesium.

Owing to this reflective layer, if a photon hv, of which the trajectory is shown by a wavy arrow in the single FIGURE, is not absorbed by the amorphous silicon layers of the photodiode during its first incidence, it is reflected and can therefore again generate an electron-hole pair, which increases the quantum efficacy of the device.

Similarly, in the case in which the circuit comprises microlenses, it is possible that the lenses will not be suitably aligned with respect to the lower electrodes. In this case, the circuit makes it possible to compensate for this defect by sending the unfocused photons to the amorphous silicon, thus again improving the quantum efficacy of the device.

In addition, to limit the negative impact of the external medium (heat, radiation, etc.) on the integrated circuits, the latter are generally protected in opaque housings. This mode of protection typically cannot be used as such for photosensitive integrated circuits.

Moreover, under strong illumination, the performance of electronic devices including photosensitive integrated circuits can be significantly hindered due to the generation of charges in the doped areas of the transistors.

These stored charges may cause parasitic phenomena such as:
the increase in background noise of the detector (increase in the dark current), and
the variation in control voltages of the transistors (unique behavior of one transistor with respect to another).

But the reflective layer 7 may limit these negative effects by protecting the control transistors from these so-called "stacking" effects.

Finally, the integration of a reflective and protective layer may make it possible to obtain more dynamic sensors (better response between weak and strong illumination).

Furthermore, the metal of the metal oxide used in the production of the reflective layer may be chosen on the basis of the anticipated wavelength of the incident radiation, as the reflective properties of a material may vary with wavelength.

From the foregoing it will be appreciated that, although specific embodiments have been described herein for purposes of illustration, various modifications may be made without deviating from the spirit and scope of the present disclosure.

The invention claimed is:
1. Photosensitive integrated circuit comprising:
at least one photodiode having an electrode coupled to a conductive element, the photodiode configured so as to convert incident electromagnetic radiation into a current by absorbing photons into at least one amorphous silicon layer by creating electron-hole pairs; and
a reflective layer capable of reflecting unabsorbed photons, said reflective layer being located contiguous with the at least one photodiode, inserted between a passivation layer and the amorphous silicon layers, wherein the conductive element coupled to the electrode penetrates the reflective layer.

2. Photosensitive integrated circuit according to claim 1, in which the reflective layer comprises a white material made from a metal oxide.

3. Photosensitive integrated circuit according to claim 2, in which metal of the metal oxide is chosen from the group including at least titanium, aluminum, zirconium and magnesium.

4. Photosensitive integrated circuit according to claim 1, in which the reflective layer has a reflection surface of which a roughness is chosen so as to produce a specular or diffuse reflection.

5. A semiconductor structure, comprising:
a photodiode having a conductive element and having an electromagnetic energy receiving first surface and a second surface that is opposite to the first surface; and
a non-metal reflector disposed contiguous with the second surface of the photodiode and disposed between a passivation layer and an amorphous silicon layer, the reflector operable to reflect unabsorbed photons to the electromagnetic energy receiving first surface wherein the conductive element penetrates the reflector.

6. The semiconductor structure of claim 5 wherein the reflector comprises a white material that comprises a metal oxide.

7. The semiconductor structure of claim 5 wherein the reflector comprises a rough surface that is contiguous with the second surface of the photodiode.

8. The semiconductor structure of claim 5, further comprising an upper electrode and a lower electrode disposed on either side of the electromagnetic energy receiving first surface.

9. The semiconductor structure of claim 8, further comprising a planarizing layer disposed adjacent to the upper electrode.

10. The semiconductor structure of claim 9, further comprising a microlens disposed adjacent to the planarizing layer.

11. The semiconductor structure of claim 5, further comprising a filter disposed in a path for photons and operable to filter the photons.

12. The semiconductor structure of claim 5, wherein the electromagnetic energy receiving first surface comprises a boundary between a p-doped amorphous silicon layer and an n-doped amorphous silicon layer.

13. The semiconductor structure of claim 5, wherein the electromagnetic energy receiving first surface comprises a boundary between a p-doped amorphous silicon layer and a layer other than an amorphous silicon layer.

14. The semiconductor structure of claim 5, wherein the electromagnetic energy receiving first surface comprises a boundary between an n-doped amorphous silicon layer and a layer other than an amorphous silicon layer.

* * * * *

UNITED STATES PATENT AND TRADEMARK OFFICE
CERTIFICATE OF CORRECTION

PATENT NO.       : 8,044,443 B2                           Page 1 of 1
APPLICATION NO.  : 11/603961
DATED            : October 25, 2011
INVENTOR(S)      : Jérôme Alieu et al.

It is certified that error appears in the above-identified patent and that said Letters Patent is hereby corrected as shown below:

- In Claim 5, Column 5, Line 23 of the patent, please change the text "tromagnetic energy receiving first surface wherein the" to --tromagnetic energy receiving first surface, wherein the--.

Signed and Sealed this
Tenth Day of April, 2012

David J. Kappos
*Director of the United States Patent and Trademark Office*